United States Patent
Yu et al.

(10) Patent No.: US 7,634,041 B2
(45) Date of Patent: Dec. 15, 2009

(54) PHASE LOCKED LOOP FREQUENCY SYNTHESIZER

(75) Inventors: Tai Yuan Yu, Chungli (TW); Ling-Wei Ke, Hsinchu Hsien (TW); Tser-Yu Lin, Hsinchu (TW); Hsin-Hung Chen, Miaoli Hsien (TW)

(73) Assignee: Mediatek Inc., Hsin-Chu (TW)

( * ) Notice: Subject to any disclaimer, the term of this patent is extended or adjusted under 35 U.S.C. 154(b) by 499 days.

(21) Appl. No.: 11/616,933

(22) Filed: Dec. 28, 2006

(65) Prior Publication Data

US 2008/0157823 A1 Jul. 3, 2008

(51) Int. Cl.
*H04D 3/24* (2006.01)
(52) U.S. Cl. ...................................... 375/376
(58) Field of Classification Search ................. 375/285, 375/296, 375–376; 341/143
See application file for complete search history.

(56) References Cited

U.S. PATENT DOCUMENTS

| | | | |
|---|---|---|---|
| 6,008,703 A | 12/1999 | Perrott et al. | |
| 6,011,815 A | 1/2000 | Eriksson et al. | |
| 6,686,803 B1 * | 2/2004 | Perrott et al. | ................. 331/10 |
| 2004/0081266 A1 * | 4/2004 | Adachi et al. | ............... 375/376 |
| 2005/0025276 A1 | 2/2005 | Hammes et al. | |
| 2005/0213697 A1 * | 9/2005 | Adachi et al. | ............... 375/376 |

* cited by examiner

*Primary Examiner*—Khanh C Tran
(74) *Attorney, Agent, or Firm*—Thomas, Kayden, Horstemeyer & Risley

(57) ABSTRACT

A dynamic carrying method to prevent saturation of a sigma-delta modulator of a phase locked loop frequency synthesizer. The phase locked loop frequency synthesizer using the dynamic carrying method comprises a forward portion receiving a reference frequency signal and a first frequency signal to generate an output carrier signal; a multi-modulus divider dividing the output carrier signal frequency to generate the first frequency signal; a dynamic carrying device receiving and separating transmitting data into a carrying part and a residue part when the transmitting data amplitude exceeds a threshold; a sigma-delta modulator receiving the residue part to generate a first modulus control signal; an auxiliary modulator receiving the carrying part to generate a second modulus control signal; and a first adder receiving the first modulus control signal, the second modulus control signal, and a third modulus control signal and outputting a modulus modulation signal to modulate the multi-modulus divider.

26 Claims, 17 Drawing Sheets

US 7,634,041 B2

PHASE LOCKED LOOP FREQUENCY SYNTHESIZER

BACKGROUND OF THE INVENTION

1. Field of the Invention

The invention relates to direct frequency modulation, and in particular to a phase locked loop frequency synthesizer using dynamic carrying to prevent saturation of sigma-delta modulator thereof.

2. Description of the Related Art

FIG. 1 shows a conventional phase locked loop synthesizer 100 with a sigma-delta modulator for modulating a modulus. The phase locked loop synthesizer 100 comprises a phase-frequency detector 101, a charge pump 102, a loop filter 103, a voltage controlled oscillator (VCO), a multi-modulus divider 105, a sigma-delta modulator 106 and a channel selector 107. In direct frequency modulation system, transmitting data TD or baseband modulation data is coupled to the sigma-delta modulator 106. Signal m(t) is the sum of the transmitting data TD (or modulation data) and a DC value of a signal N_fractional. The signal N_fractional corresponds to channel information, having different DC value corresponding to different channels. Control signal Sc generated by the sigma-delta modulator 106 and a signal N_integer are summed and sent to the multi-modulus divider 105 to modulate the modulus Nmod used to divide the output carrier signal frequency of the voltage controlled oscillator 104.

FIGS. 2A to 2D show relationships of sigma-delta modulator (SDM) input DC values with respect to channels in GSM, DCS and PCS modes. After normalization, the SDM input DC value has a minimum of 0 and a maximum of 128/130 (about 0.9846), for GSM mode with reference frequency 26 MHz and channel width 200 KHz. To satisfy every channel specification in GSM, DCS or PCS mode, SDM input DC value must be close to 0 and 1. Referring to FIG. 1, the signal m(t) is the sum of the transmitting data TD and the signal N_fractional. The amplitude of the transmitting data is generally amplified by a compensation filter (not shown in FIG. 1). Thus, the amplitude of the signal m(t), after normalization, may more easily exceed 1 (a threshold) or fall below 0. The SDM input DC value above the threshold or below 0 cannot be represented by the sigma-delta modulator. In other words, such SDM input DC values saturate the sigma-delta modulator, resulting in incorrect function. FIG. 3 illustrates the SDM saturation problem described.

BRIEF SUMMARY OF INVENTION

An object of the invention is to provide a dynamic carrying method to prevent saturation of a sigma-delta modulator of a phase locked loop frequency synthesizer.

Another object of the invention is to provide a phase locked loop frequency synthesizer utilizing the dynamic carrying method to prevent saturation of a sigma-delta modulator thereof.

An exemplary embodiment of a dynamic carrying method for preventing saturation of a sigma-delta modulator modulating a phase locked frequency synthesizer, comprises: providing a dynamic carrying device for receiving and separating transmitting data into a residue part and carrying part when the transmitting data amplitude exceeds a threshold; sending the residue part to the sigma-delta modulator to generate a first modulus control signal; providing an auxiliary modulator receiving the carrying part to generate a second modulus control signal; and providing a adder summing the first and second modulus control signals to generate a modulus modulation signal for the phase locked frequency synthesizer. It is noted that the threshold represents the upper bond or lower bond value the sigma-delta modulator can process without saturation.

An exemplary embodiment of a phase locked loop frequency synthesizer comprises a forward portion receiving a reference frequency signal and a first frequency signal to generate an output carrier signal, a multi-modulus divider dividing the output carrier signal frequency to generate the first frequency signal, a dynamic carrying device receiving and separating transmitting data into a carrying part and a residue part when the transmitting data amplitude exceeds a threshold, a sigma-delta modulator receiving the residue part to generate a first modulus control signal, an auxiliary modulator receiving the carrying part to generate a second modulus control signal, and a first adder receiving the first modulus control signal, the second modulus control signal, and a third modulus control signal and outputting a modulus modulation signal to modulate the multi-modulus divider. It is noted that the sigma-delta modulator operates according to a signal transfer function and a noise transfer function, and the auxiliary modulator operates according to the signal transfer function.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 4:
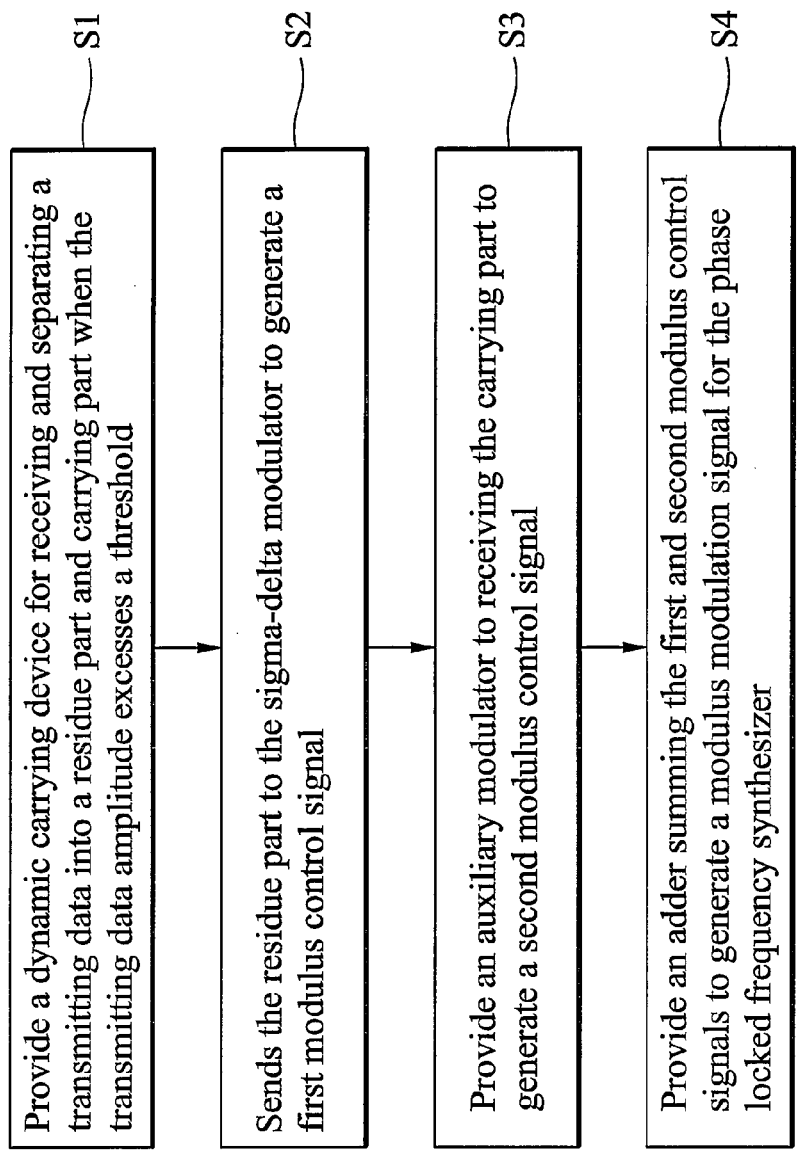
FIG. 4 is a flowchart of a dynamic carrying method according to an exemplary embodiment of the invention preventing saturation of a sigma-delta modulator which modulates a phase locked loop synthesizer.

FIG. 4 is a flowchart of a dynamic carrying method according to an exemplary embodiment of the invention for preventing saturation of a sigma-delta modulator which modulates a phase locked loop synthesizer. The dynamic carrying method comprises, in step S1, providing a dynamic carrying device receiving and separating transmitting data into a residue part and carrying part when the transmitting data amplitude exceeds a threshold. It is noted that the threshold represents the upper bond or lower bond value that the sigma-delta modulator can process without saturation. In step S2, the residue part is sent to the sigma-delta modulator to generate a first modulus control signal. The sigma-delta modulator operates normally because the residue part does not exceed the threshold. In step S3, an auxiliary modulator receives the carrying part to generate a second modulus control signal. In step S4, an adder sums the first and second modulus control signals to generate a modulus modulation signal for the phase locked frequency synthesizer.

Figure 5:
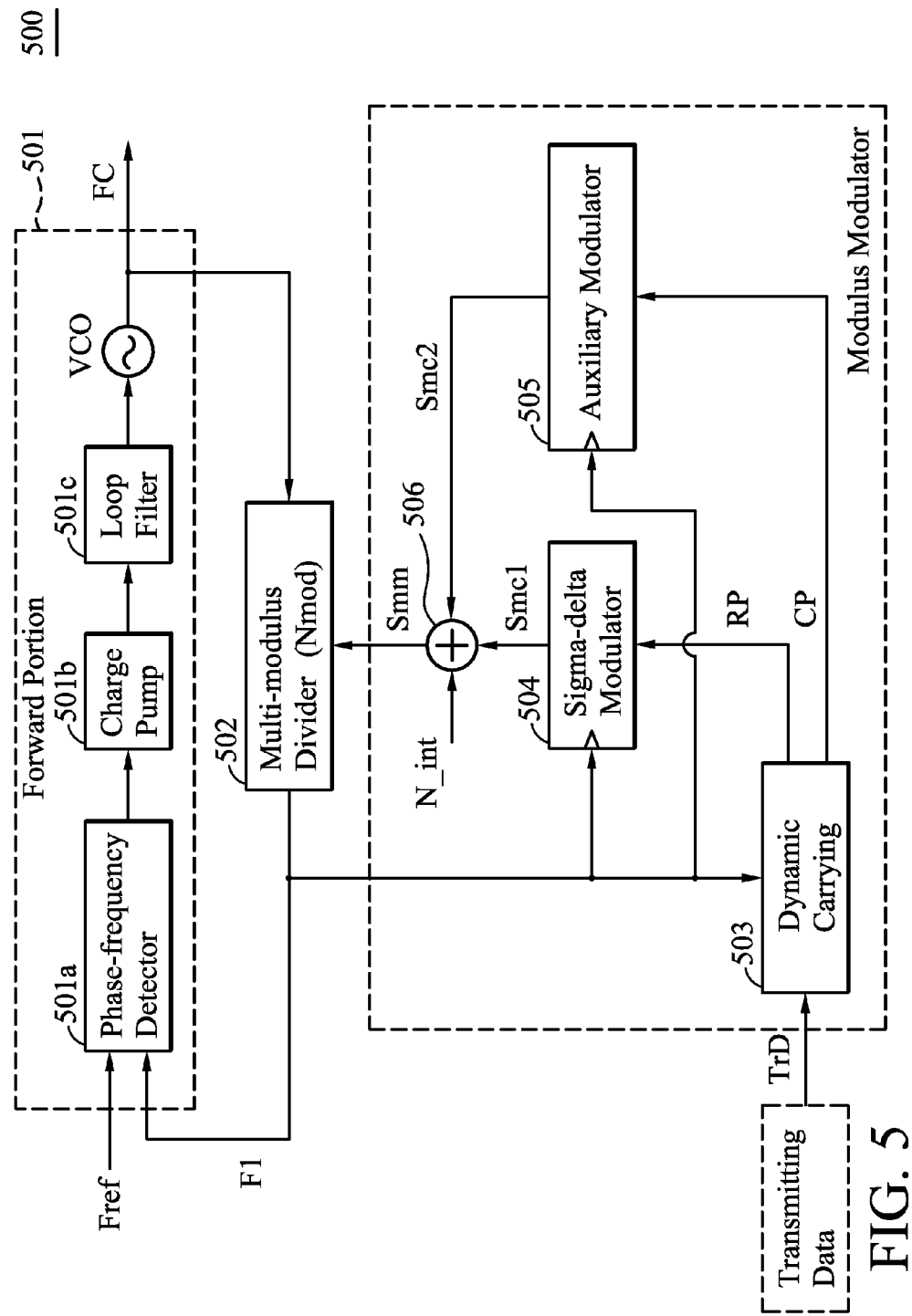
FIG. 5 shows a phase locked loop synthesizer according to an exemplary embodiment of the invention utilizing the dynamic carrying method.

FIG. 5 shows a phase locked loop synthesizer 500 according to an exemplary embodiment of the invention utilizing the dynamic carrying method. The phase locked loop synthesizer 500 comprises a forward portion 501, a multi-modulus divider 502, a dynamic carrying device 503, a sigma-delta modulator 504, an auxiliary modulator 505 and an adder 506.

The forward portion 501 receives a reference frequency signal Fref and a first frequency signal F1 to generate an output carrier signal Fc. The forward portion 501 comprises a phase-frequency detector 501a receiving the reference frequency signal Fref and the first frequency signal F1 to generate a phase difference signal; a charge-pump 501b coupled to transfer the phase difference signal to a current difference signal; a loop filter 501c coupled to filter the current difference signal to generate a control signal; and a voltage controlled oscillator VCO responsive to the control signal to generate the output carrier signal Fc.

The multi-modulus divider 502 divides the output carrier signal frequency by a modulus Nmod to generate the first frequency signal F1. In this embodiment of the invention, the sigma-delta modulator 504, the auxiliary modulator 505, the dynamic carrying device 503 and the adder 506 jointly work as a modulus modulator to modulate the modulus Nmod which the multi-modulus divider 502 uses to divide the output carrier signal frequency.

The dynamic carrying device 503 receives and separates transmitting data TrD into a carrying part CP and a residue part RP when the transmitting data amplitude exceeds a threshold. The threshold represents the upper bond or lower bond value which can be represented by the sigma-delta modulator 504. If the transmitting data amplitude exceeds the threshold, the dynamic carrying device 503 generates the carrying part CP and subtracts the transmitting data by the carrying part CP to obtain the residue part RP. If the transmitting data amplitude does not exceed the threshold, the dynamic carrying device 503 passes the transmitting data as the residue part RP and sets the carrying part CP at 0.

The sigma-delta modulator 504 receives the residue part RP to generate a first modulus control signal Smc1. The auxiliary modulator 505 receives the carrying part CP to generate a second modulus control signal Smc2. The adder 506 receives the first modulus control signal Smc1, the second modulus control signal Smc2 and a third modulus control signal N_int and outputs a modulus modulation signal Smm to modulate the multi-modulus divider 502.

Figure 6:
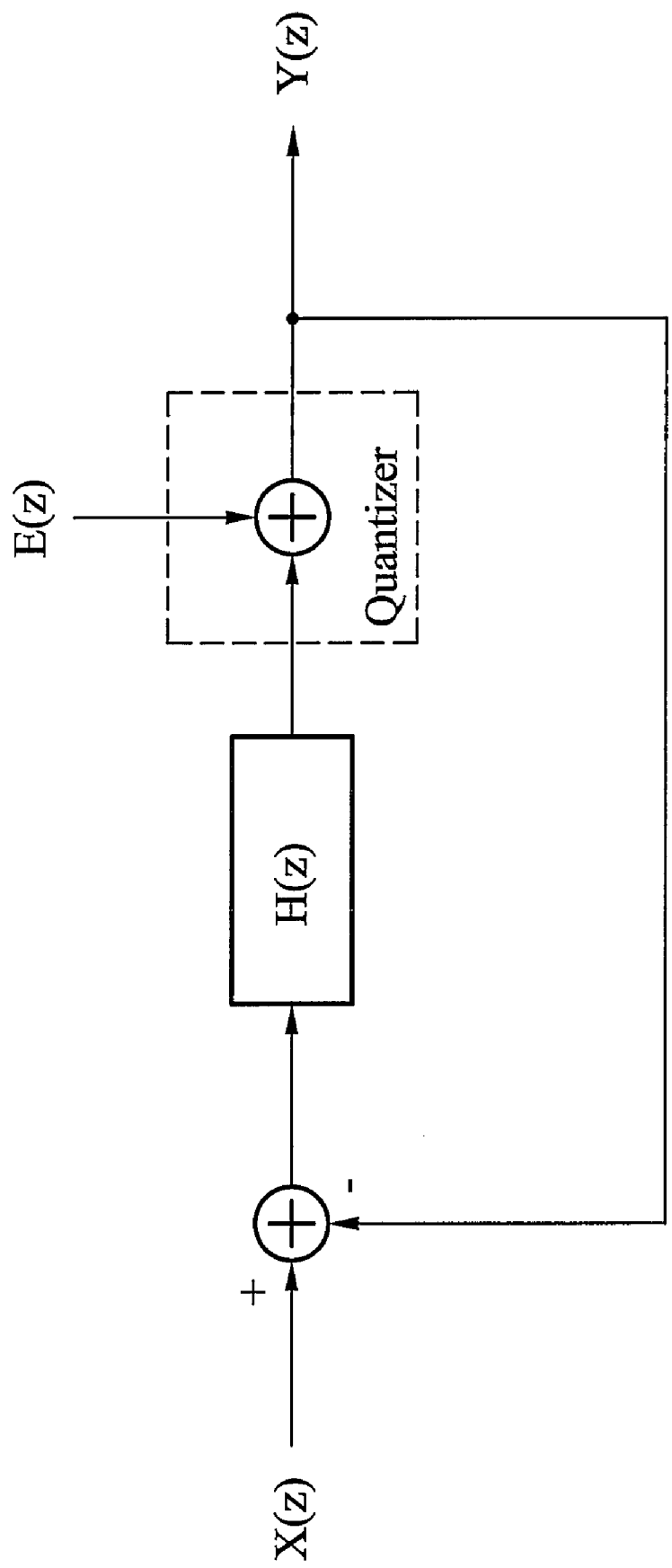
FIG. 6 shows a linear model of a sigma-delta modulator.

The sigma-delta modulator 504 performs oversampling and noise shaping on the received residue part RP. FIG. 6 shows a linear model of the sigma-delta modulator 504. Based on the linear model, a relationship (in frequency domain) between input signal X(z), output signal Y(z) and quantized noise signal E(z) is obtained as:

$$Y(z) = \frac{H(z)}{1+H(z)}X(z) + \frac{1}{1+H(z)}E(z).$$

Thus, the sigma-delta modulator operates according to a signal transfer function $$STF\left(=\frac{H(z)}{1+H(z)}\right)$$

and a noise transfer function $$NTF\left(=\frac{1}{1+H(z)}\right).$$

In this embodiment, the auxiliary modulator 505 operates according to the signal transfer function STF, to ensure that the residue part RP and carrying part CP are processed by the same signal transfer function STF. Generally, H(z) may be implemented by an m-order discrete-time integrator, thereby resulting in a STF of $z^{-m}$. Therefore, the auxiliary modulator 505 can be implemented by a delay line module, but is not limited thereto.

Figure 7A:
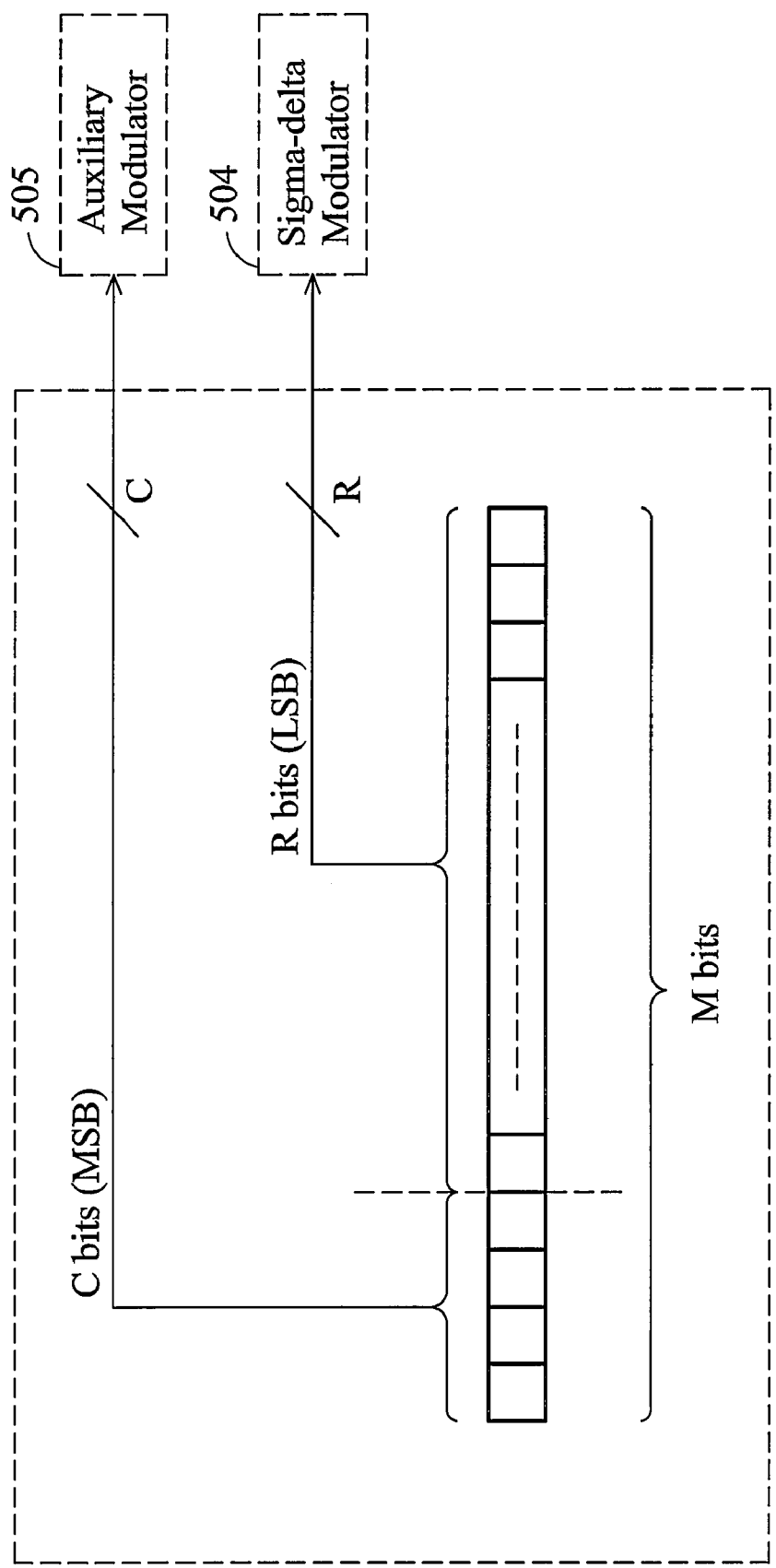
FIGS. 7A and 7B show two possible hardware implementations of dynamic carrying.

FIG. 7A shows one possible hardware implementation of dynamic carrying. The transmitting data is a digital value of M bits with R LSB bits representing the residue part and C MSB bits representing the carrying part, the threshold corresponds to $2^R-1$ and M equals R+C, M, R and C are integers. In FIG. 7A, C, R and M are 4, 23 and 27 respectively. Thus, the carrying part has 4 bits and residue part has 23 bits. The upper bond value for sigma-delta modulator is $2^{23}-1$. The dynamic carrying device 503 directly feeds the 4-bit carrying part CP to the auxiliary modulator 505 and directly feeds the 23-bit residue part RP to the sigma-delta modulator 504. Accordingly, simple wire connection and bit arrangement can be utilized to reduce complexity of dynamic carrying device implementation. In addition, the auxiliary modulator 505 can be constructed by simple register and adder.

Figure 7B:
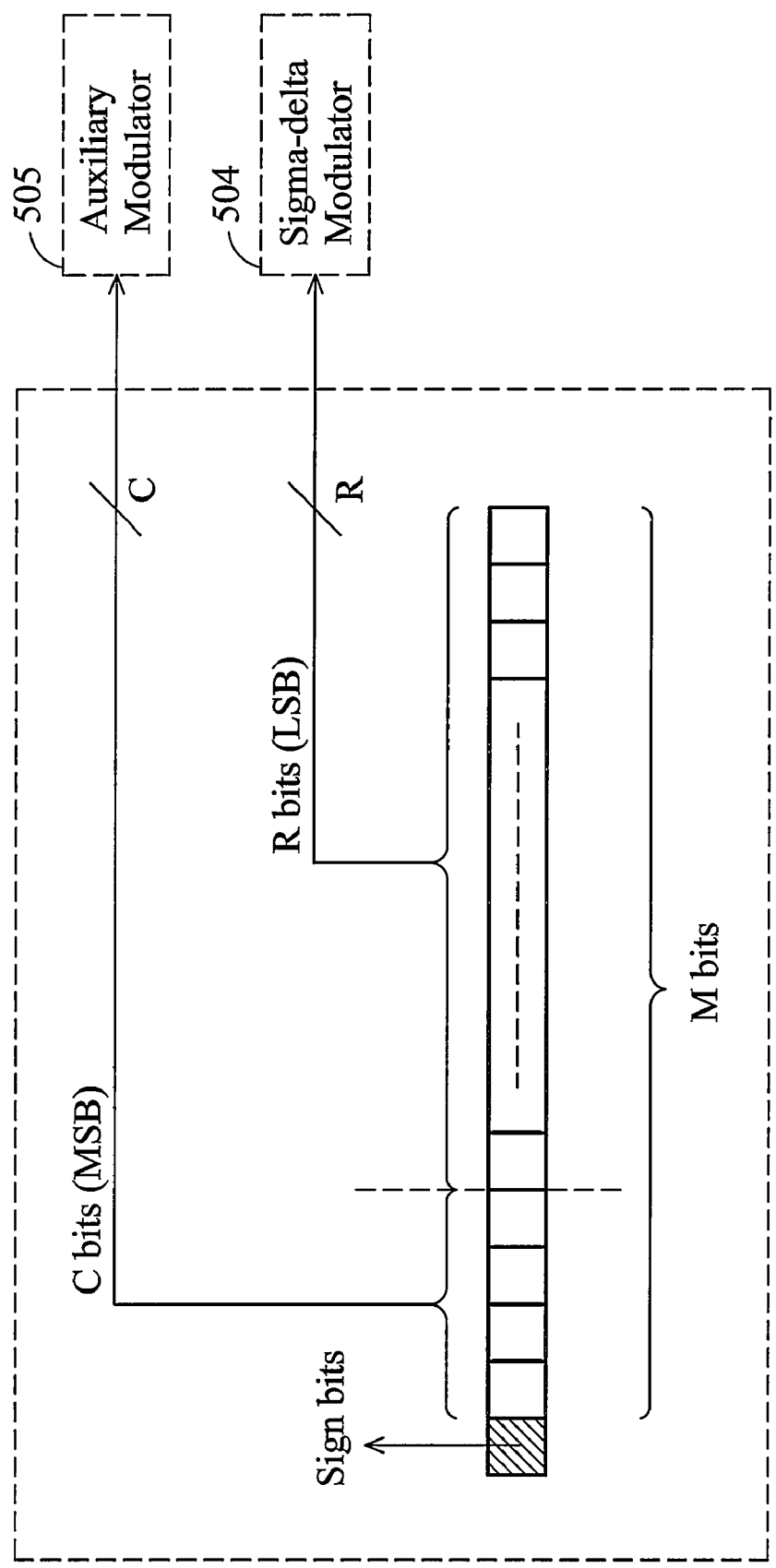

To deal with underflow of transmitting data, a sign bit is further provided and two's complement algorithm is used. FIG. 7B shows another possible hardware implementation of dynamic carrying. The transmitting data further comprises a sign bit SB. When the sign bit SB is 0, the dynamic carrying device 503 directly feeds the 4-bit carrying part CP to the auxiliary modulator 505 and directly feeds the 23-bit residue part RP to the sigma-delta modulator 504. When the sign bit SB is 1, the transmitting data is negative and the dynamic carrying device further carries out two's complement operation on the transmitting data, directly feeding the 4-bit carrying part and the 23-bit residue part respectively to the auxiliary modulator 505 and the sigma-delta modulator 504.

Figure 8:
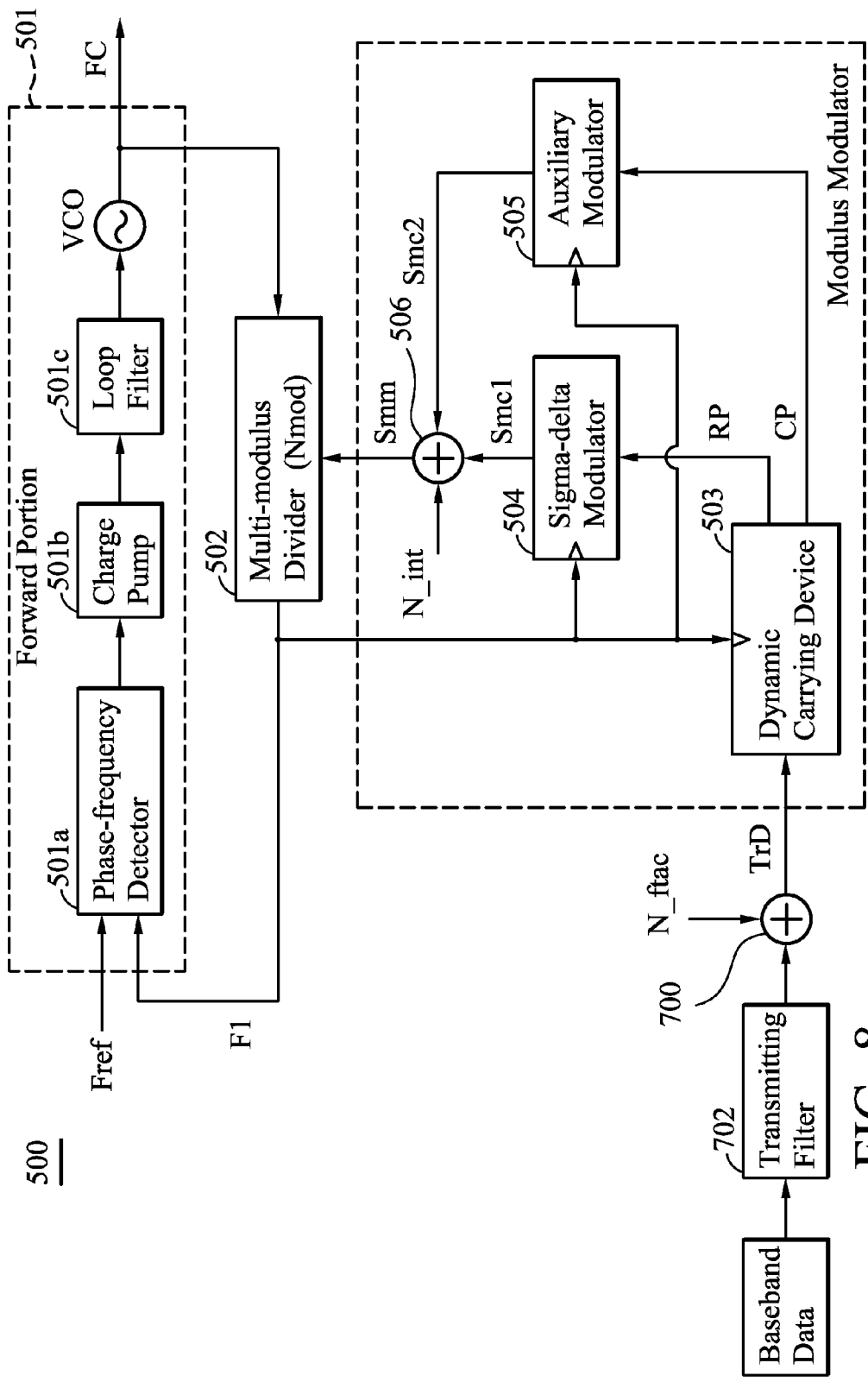
FIG. 8 shows another phase locked loop synthesizer according to another exemplary embodiment of the invention utilizing the dynamic carrying method.

The phase locked loop frequency synthesizer 500 further comprises an adder 700 coupled to baseband data and a fourth modulus control signal to generate the transmitting data, as depicted in FIG. 8. The fourth modulus control signal N_frac corresponds to a fractional part of the modulated modulus Nmod which divides the output carrier signal frequency, and the third modulus control signal N_int corresponds to an integral part of the modulated modulus Nmod. In FIG. 8, a transmitting filter 702 is coupled to receive a baseband data and sending a filtered data to the adder 700.

Figure 9:
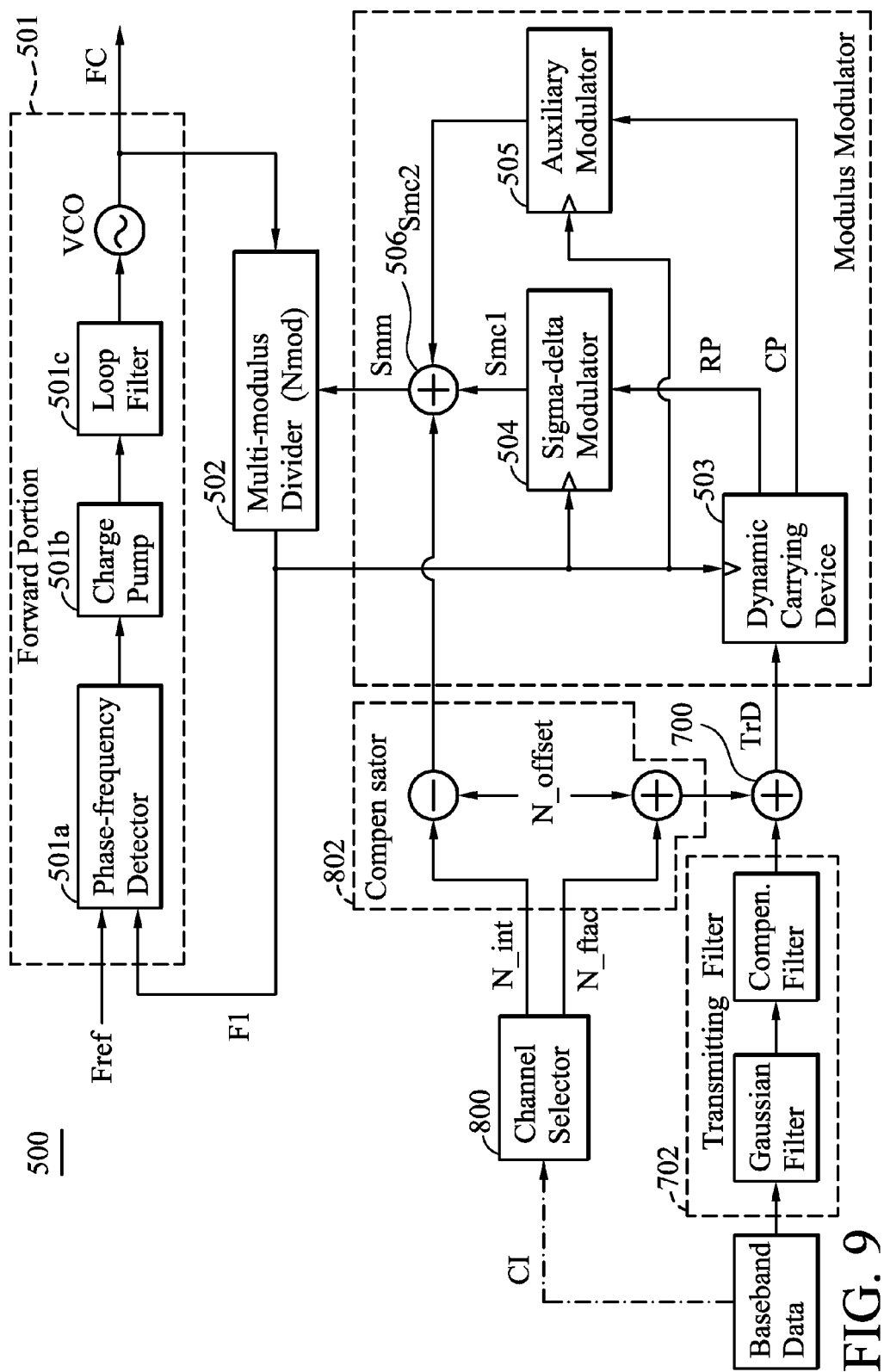
FIG. 9 shows yet another phase locked loop synthesizer according to an exemplary embodiment of the invention utilizing the dynamic carrying method.

The phase locked loop frequency synthesizer 500 further comprises a channel selector 800, as depicted in FIG. 9. The channel selector 800 is coupled to the baseband data to generate the third and fourth modulus control signals N_int and N_frac according to channel information CI imposed on the baseband data. In FIG. 9, the phase locked loop frequency synthesizer 500 further comprises a compensator 802 for adjusting the fourth modulus control signal N_frac with a first offset N_offset and adjusting the third modulus control signal N_int with a second offset –N_offset. The offset value N_offset corresponds to the channel used. The first offset N_offset is added to shift the transmitting data TrD to an all positive value corresponding to the sigma-delta modulator 504.

Further, the transmitting filter 802 comprises a Gaussian filter and a compensation filter connected in series, as shown in FIG. 9. In FIGS. 5, 8, and 9, the dynamic carrying device 503, the sigma-delta modulator 504, and the auxiliary modulator 505 are synchronized with the multi-modulus divider 502.

Figure 1:
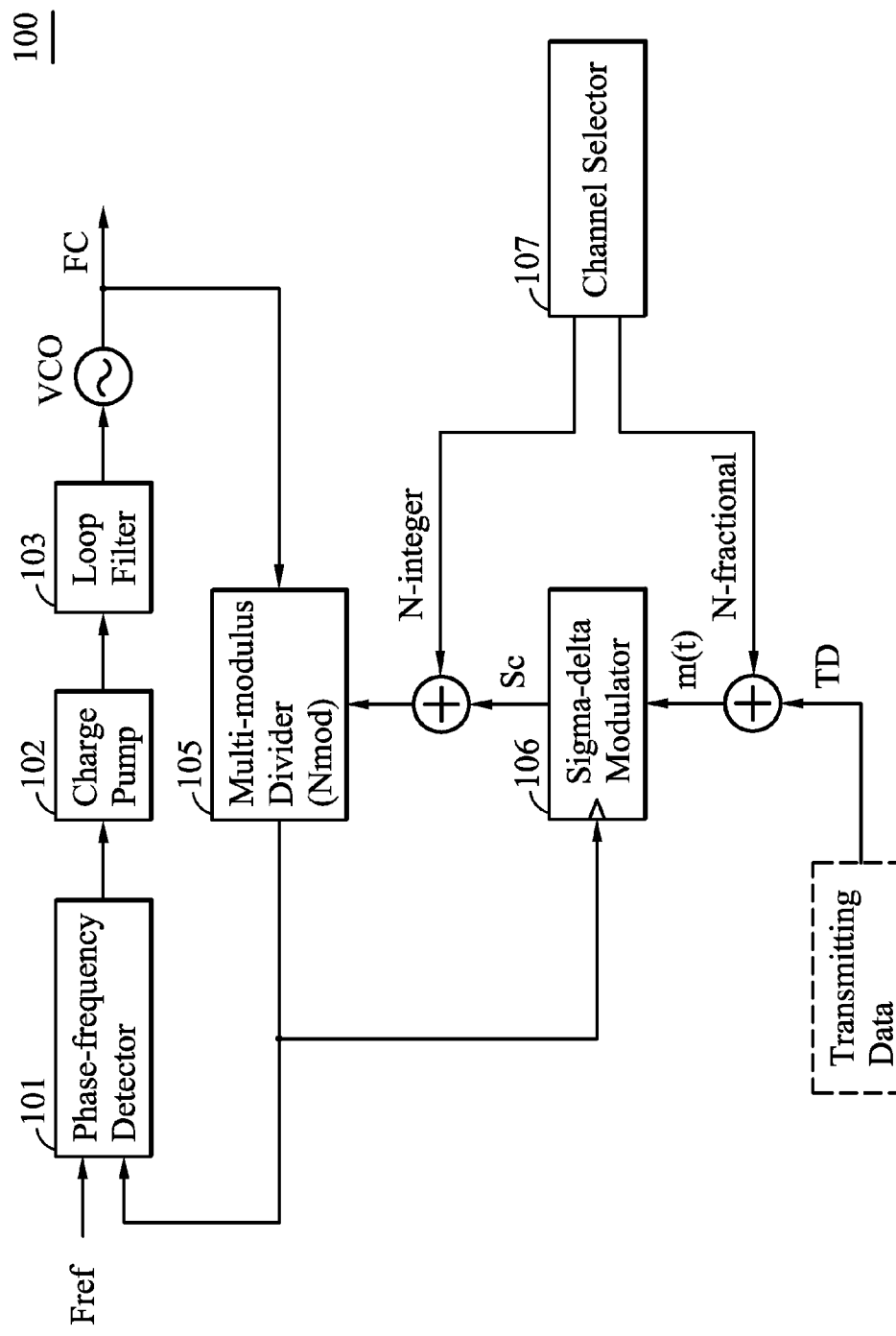
FIG. 1 shows a conventional phase locked loop synthesizer with a sigma-delta modulator for modulating a modulus.
Figure 2A:
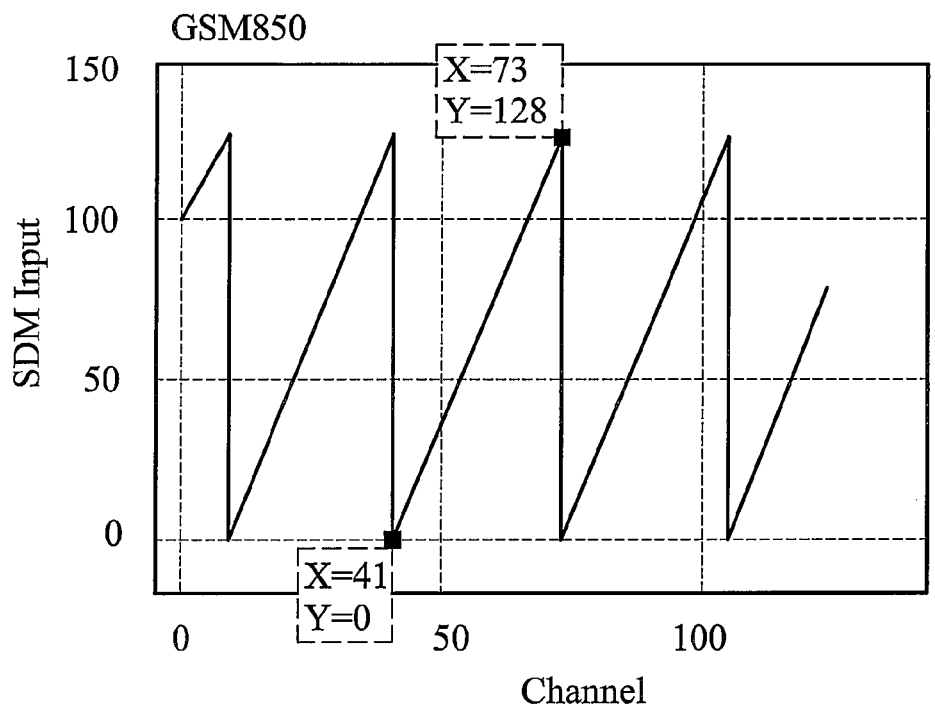
FIGS. 2A to 2D show relationships of sigma-delta modulator (SDM) input DC values with respect to channels in GSM, DCS and PCS modes.
Figure 2B:
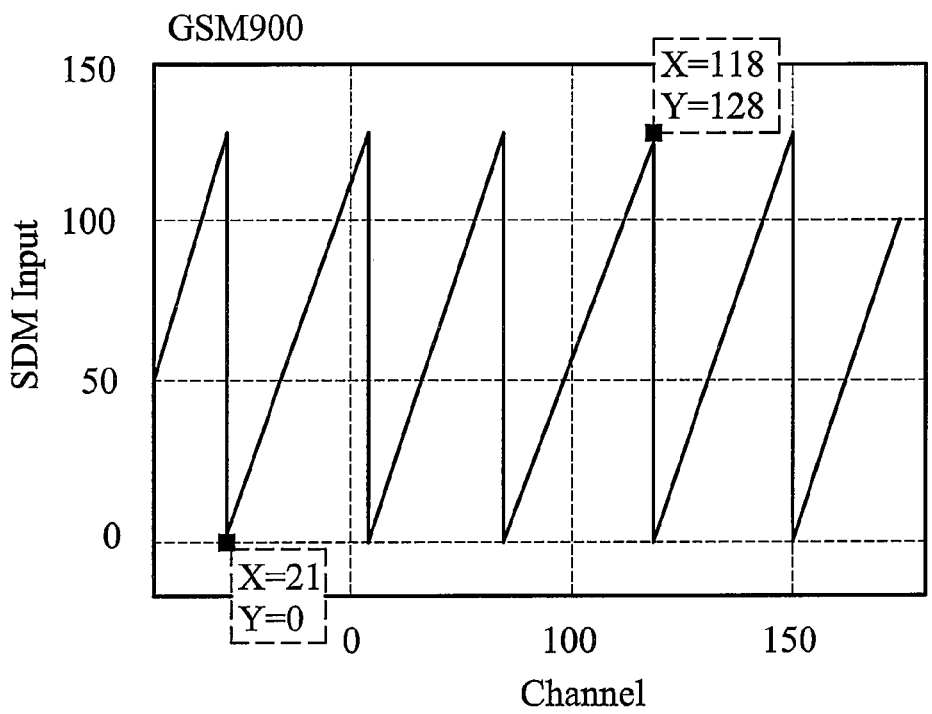
Figure 2C:
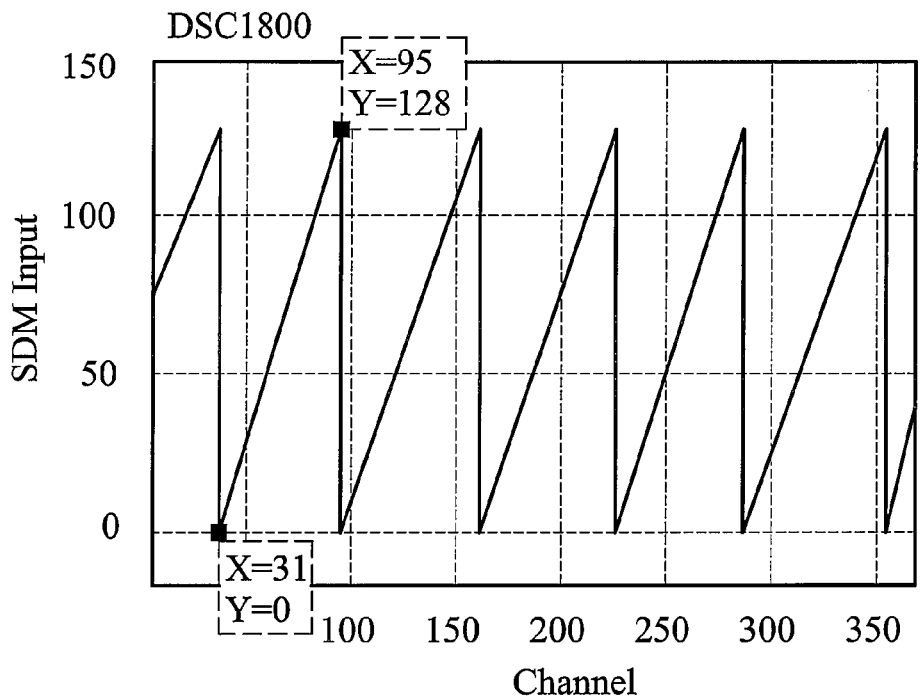
Figure 2D:
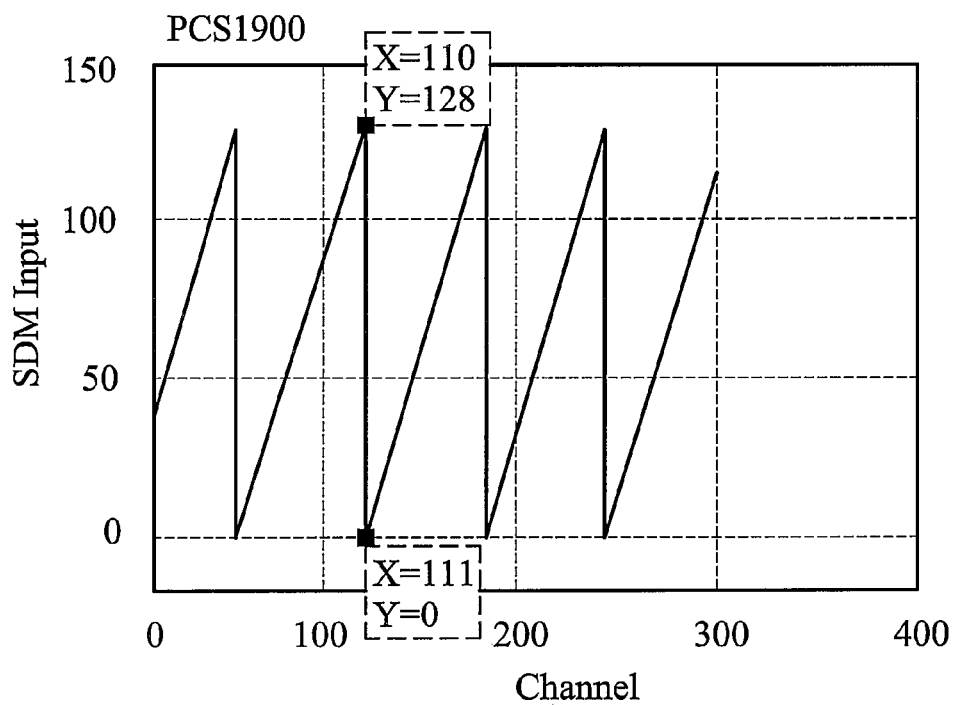
Figure 3:
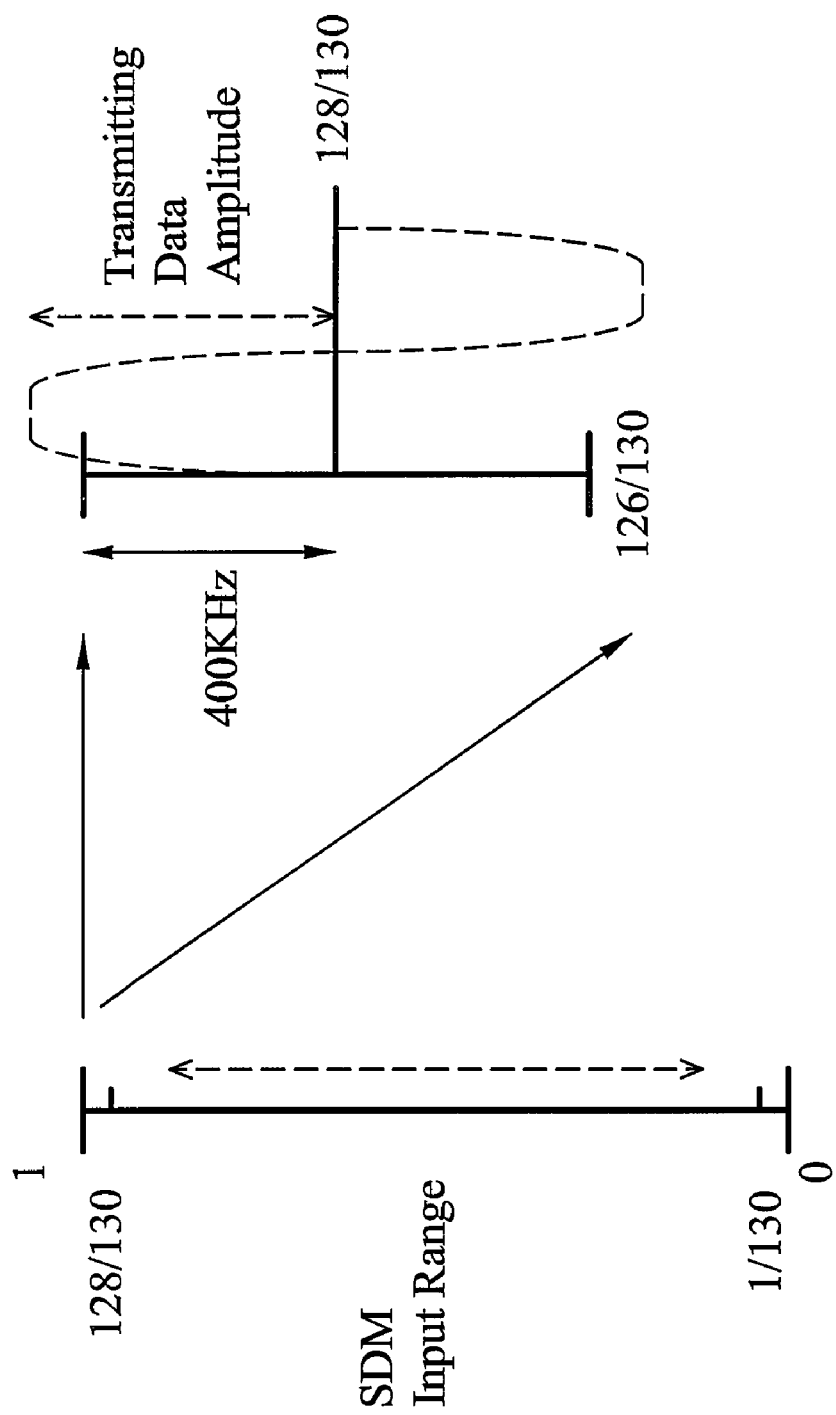
FIG. 3 illustrates SDM saturation.
Figure 10A:
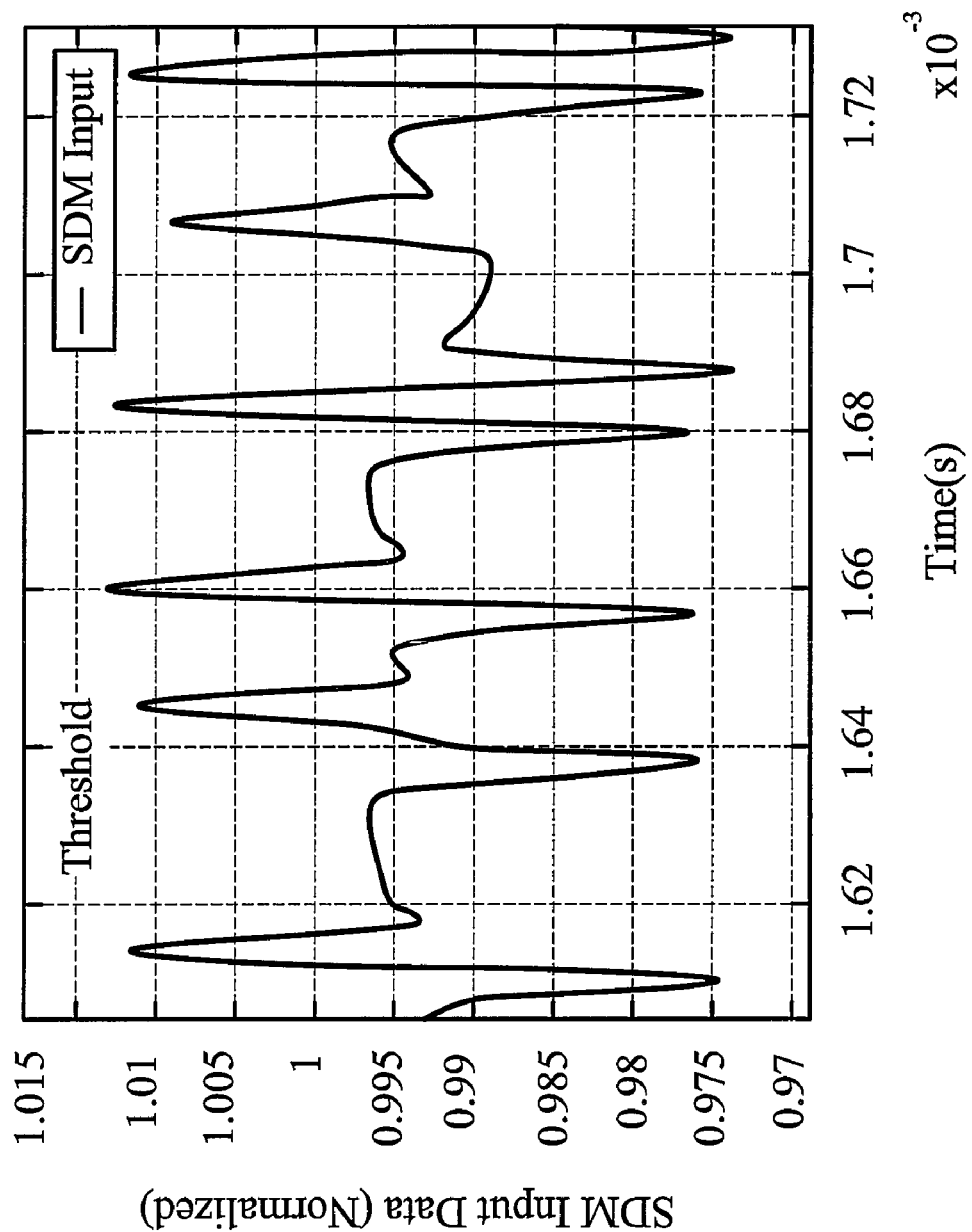
FIGS. 10A and 10B show transmitting data (SDM input data) with amplitude exceeding 1 (threshold), and a first frequency deviation of a first output carrier signal output from a first phase locked loop frequency synthesizer (as shown in FIG. 1) not utilizing the dynamic carrying method.
Figure 10B:
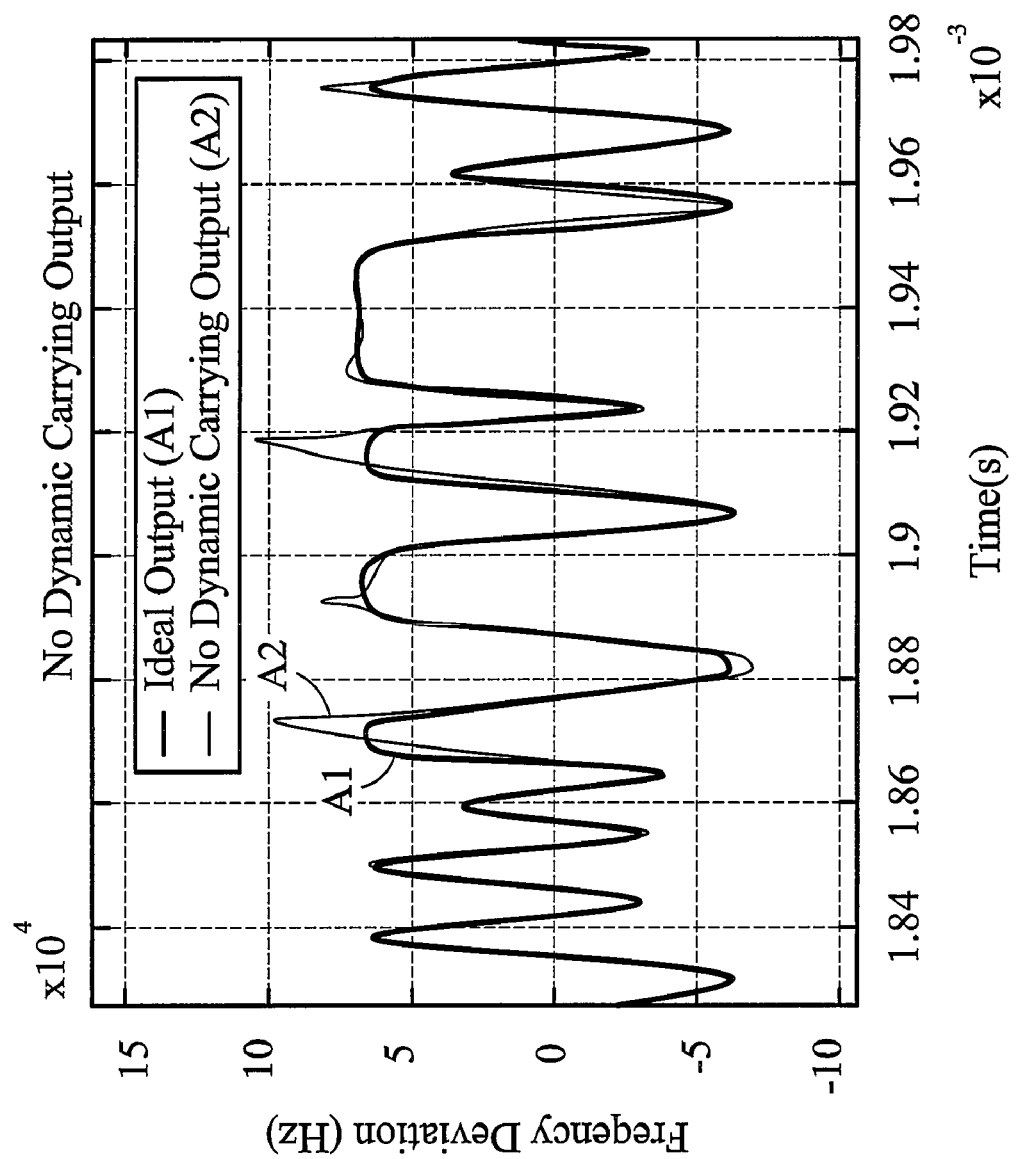
Figure 11A:
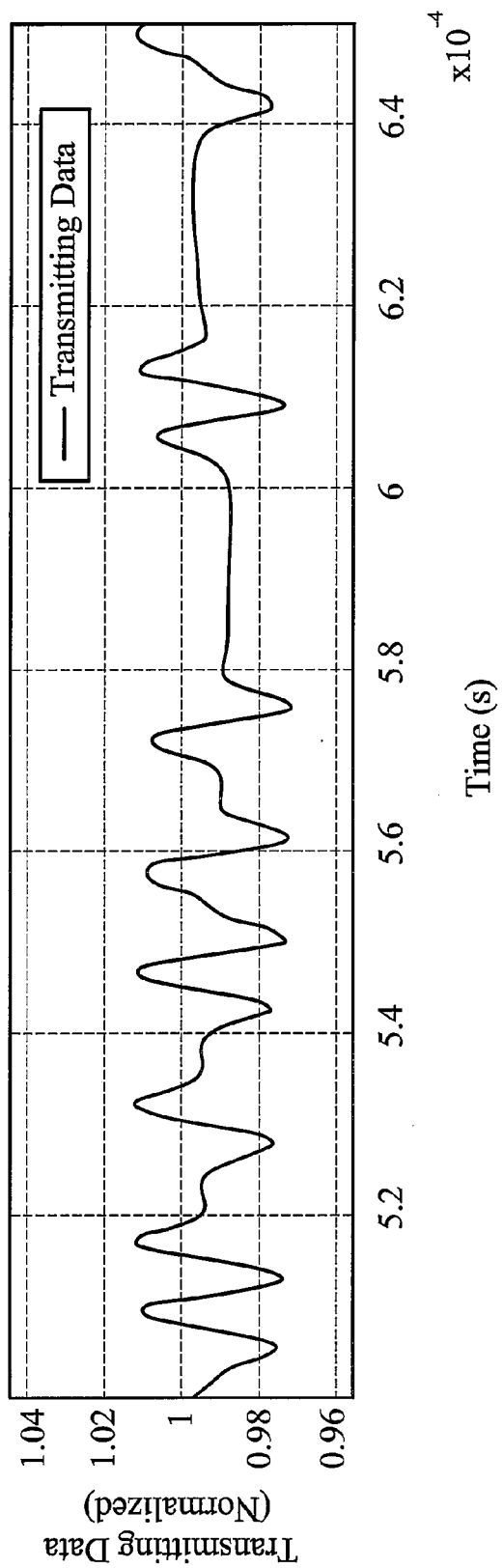
FIGS. 11A to 11D show transmitting data TrD with amplitude exceeding 1 (threshold), carrying part and residue part output from the dynamic carrying device, and the frequency deviation of a second output carrier signal output from a second phase locked loop frequency synthesizer (as shown in FIG. 8) using the dynamic carrying method.
Figure 11B:
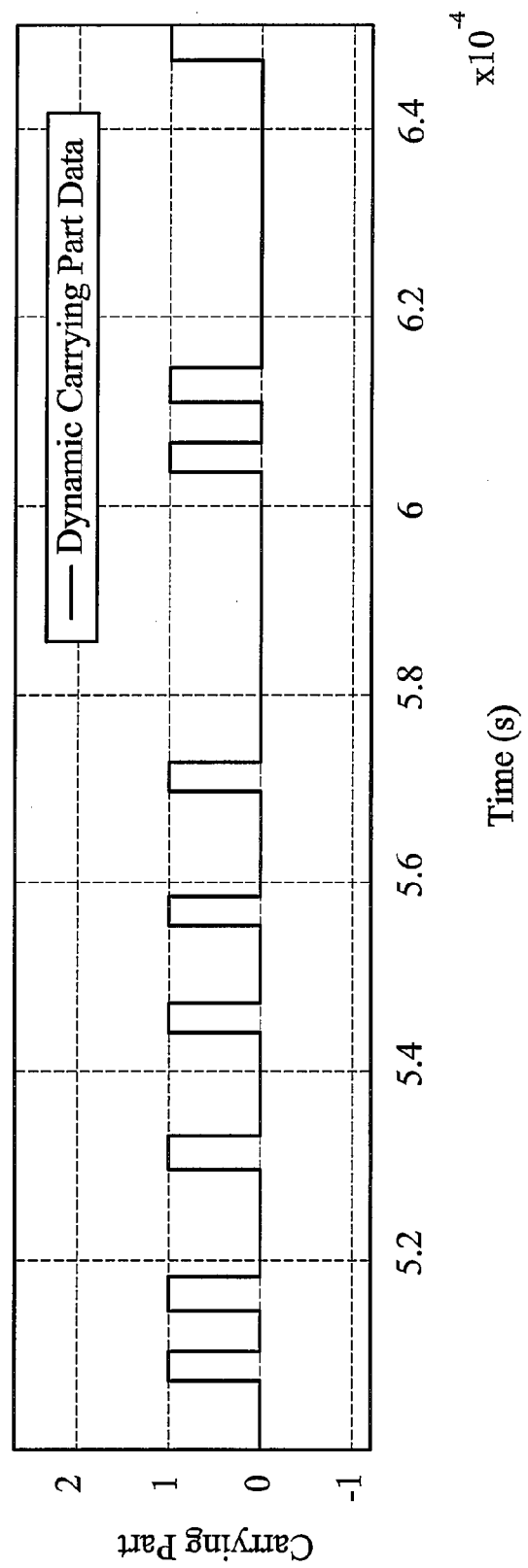
Figure 11C:
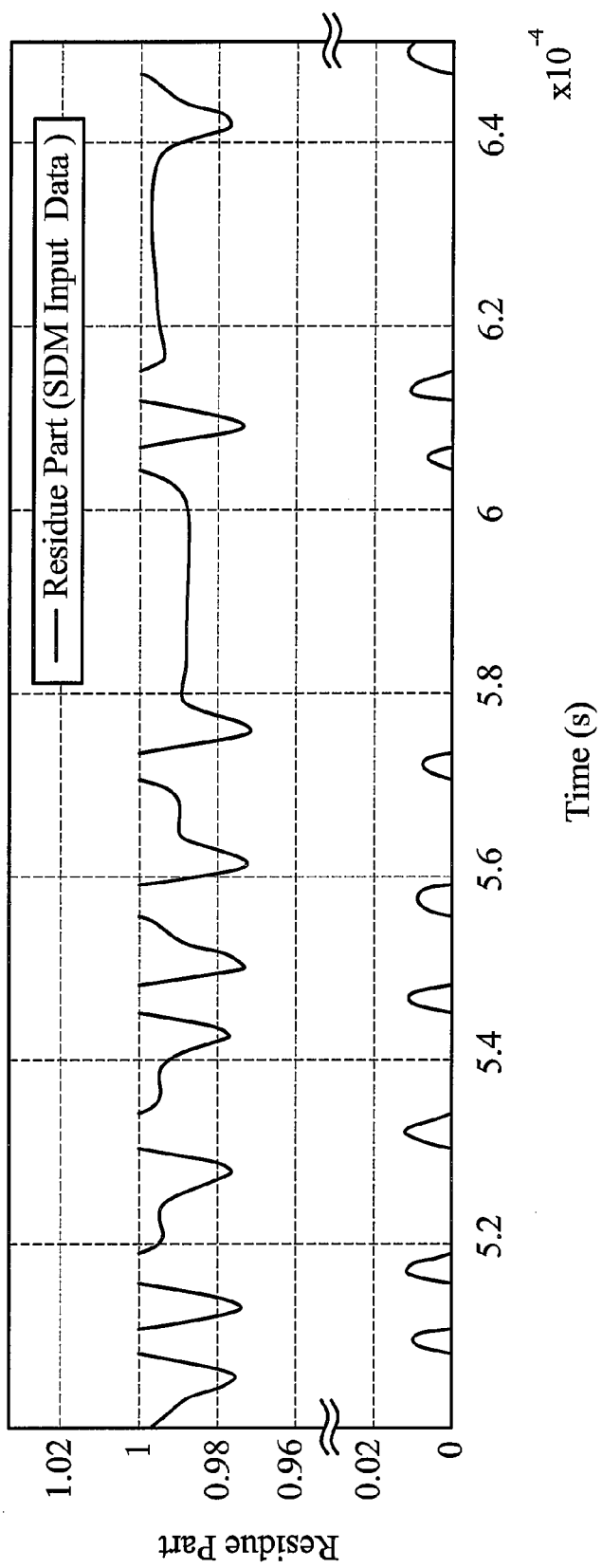
Figure 11D:
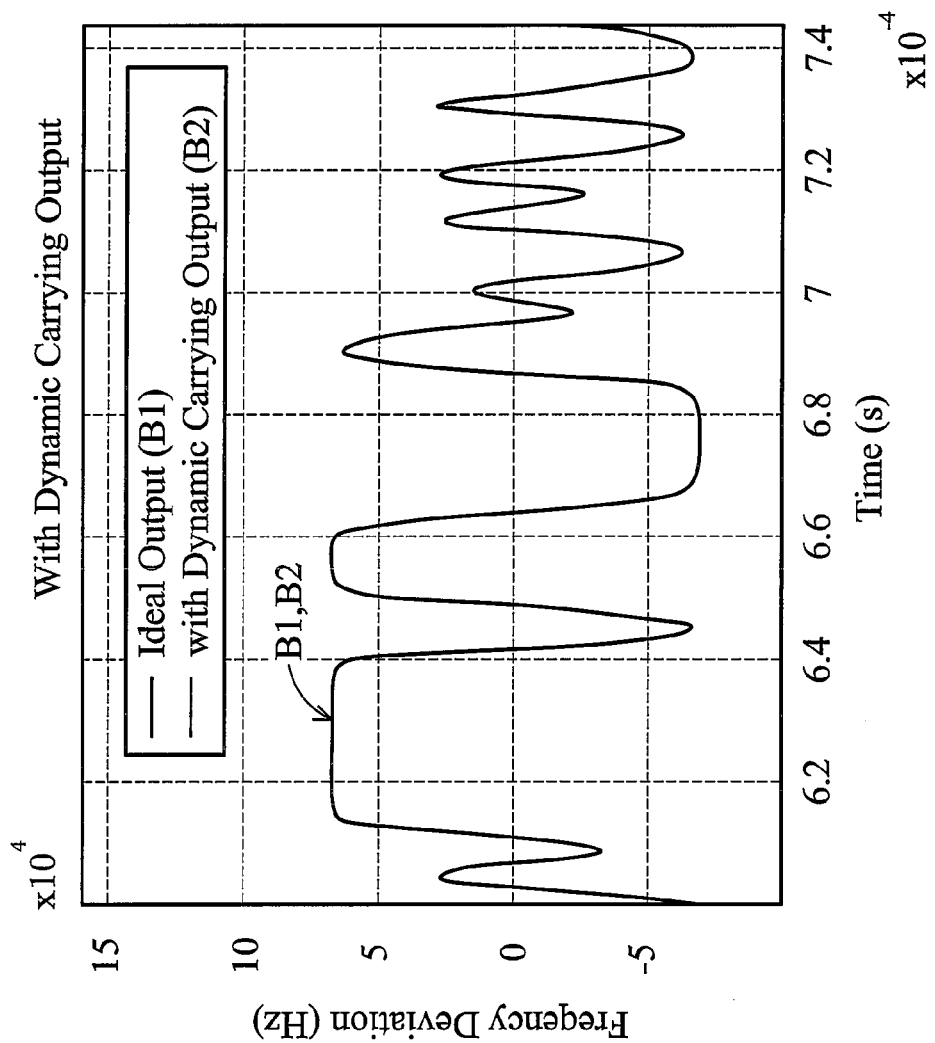

FIGS. 10A and 10B show transmitting data (SDM input data) with amplitude exceeding 1 (threshold) and a first frequency deviation of a first output carrier signal output from a first phase locked loop frequency synthesizer (as shown in FIG. 1) without using the dynamic carrying method. In FIG. 10B, curves A1 and A2 represent ideal output frequency deviation and SDM saturation (without dynamic carrying) output frequency deviation. FIGS. 11A to 11D show transmitting data TrD with amplitude exceeding 1 (threshold), carrying part CP and residue part RP output from the dynamic carrying device, and the frequency deviation of a second output carrier signal output from a second phase locked loop frequency synthesizer (as shown in FIG. 8) using the dynamic carrying method. In FIG. 11D, curves B1 and B2 represent ideal output frequency deviation and SDM saturation output frequency deviation. Comparing curves A2 and B2, it can be seen that the second phase locked loop frequency synthesizer using dynamic carrying method provides improved performance in output frequency deviation.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A phase locked loop frequency synthesizer, comprising:
    a forward portion receiving a reference frequency signal and a first frequency signal to generate an output carrier signal;
    a multi-modulus divider dividing the output carrier signal frequency to generate the first frequency signal;
    a dynamic carrying device receiving and separating transmitting data into a carrying part and a residue part when the transmitting data amplitude exceeds a threshold;
    a sigma-delta modulator receiving the residue part to generate a first modulus control signal;
    an auxiliary modulator receiving the carrying part to generate a second modulus control signal; and
    a first adder receiving the first modulus control signal, the second modulus control signal, and a third modulus control signal and outputting a modulus modulation signal to modulate the multi-modulus divider.

2. The phase locked loop frequency synthesizer as claimed in claim 1, wherein the sigma-delta modulator operates according to a signal transfer function and a noise transfer function, and the auxiliary modulator operates according to the signal transfer function.

3. The phase locked loop frequency synthesizer as claimed in claim 1, wherein the auxiliary modulator is a delay line module.

4. The phase locked loop frequency synthesizer as claimed in claim 1, wherein the threshold represents the upper bound value that the sigma-delta modulator can process without saturation.

5. The phase locked loop frequency synthesizer as claimed in claim 4, wherein the transmitting data is a digital value of M bits with R LSB (least significant bit) bits representing the residue part and C MSB (most significant bit) bits representing the carrying part, the threshold corresponds to $2^R-1$, and M equals R+C, M, R and C are integers.

6. The phase locked loop frequency synthesizer as claimed in claim 5, wherein the transmitting data further comprises a sign bit, and the dynamic carrying device further carries out two's complement operation on the transmitting data when the sign bit indicates that the transmitting data value is negative, then separates the transmitting data of M bits into the carrying part and the residue part.

7. The phase locked loop frequency synthesizer as claimed in claim 1, further comprises a second adder coupled to baseband data and a fourth modulus control signal to generate the transmitting data, wherein the fourth modulus control signal corresponds to a fractional part of a modulated modulus which divides the output carrier signal frequency, and the third modulus control signal corresponds to an integral part of the modulated modulus.

8. The phase locked loop frequency synthesizer as claimed in claim 7, further comprising a transmitting filter receiving the baseband data and sending filtered data to the second adder.

9. The phase locked loop frequency synthesizer as claimed in claim 8, wherein the transmitting filter comprises a Gaussian filter and a compensation filter connected in series.

10. The phase locked loop frequency synthesizer as claimed in claim 9, further comprising a channel selector receiving the baseband data to generate the third and fourth modulus control signal according to channel information imposed on the baseband data.

11. The phase locked loop frequency synthesizer as claimed in claim 10, further comprising a compensator adjusting the fourth modulus control signal with a first offset and adjusting the third modulus control signal with a second offset, wherein the first and second offset have the same value but different polarities.

12. The phase locked loop frequency synthesizer as claimed in claim 10, wherein the forward portion comprises:
    a phase-frequency detector receiving the reference frequency signal and the first frequency signal to generate a phase difference signal;

a charge-pump coupled to transfer the phase difference signal to a current difference signal;

a loop filter coupled to filter the current difference signal to generate a control signal; and a voltage controlled oscillator responsive to the control signal to generate the output carrier signal.

13. The phase locked loop frequency synthesizer as claimed in claim 1, wherein the residue part is smaller than the threshold.

14. A modulus modulator for a phase locked loop frequency synthesizer with a multi-modulus divider, comprising:

a dynamic carrying device receiving and separating transmitting data into a carrying part and a residue part when the transmitting data amplitude exceeds a threshold;

a sigma-delta modulator receiving the residue part to generate a first modulus control signal;

an auxiliary modulator receiving the carrying part to generate a second modulus control signal; and a first adder receiving the first modulus control signal and the second modulus control signal, outputting a modulus modulation signal to modulate the multi-modulus divider.

15. The modulus modulator as claimed in claim 14, wherein the sigma-delta modulator operates according to a signal transfer function and a noise transfer function, and the auxiliary modulator operates according to the signal transfer function.

16. The modulus modulator as claimed in claim 14, wherein the auxiliary modulator is a delay line module.

17. The modulus modulator as claimed in claim 14, wherein the threshold represents the upper bound value that the sigma-delta modulator can process without saturation.

18. The modulus modulator as claimed in claim 17, wherein the transmitting data is a digital value of M bits with R LSB (least significant bit) bits representing the residue part and C MSB (most significant bit) bits representing the carrying part, the threshold corresponds to $2^R-1$, and M=R+C, M, R and C are integers.

19. The modulus modulator as claimed in claim 18, wherein the dynamic carrying device directly sends the residue part of R bits to the sigma-delta modulator and the carrying part of C bits to the auxiliary modulator.

20. The modulus modulator as claimed in claim 19, wherein the transmitting data further comprises a sign bit, and the dynamic carrying device further carries out two's complement operation on the transmitting data when the sign bit indicates that the transmitting data value is negative, then separating the transmitting data of M bits into the carrying part and the residue part.

21. A dynamic carrying method for preventing saturation of a sigma-delta modulator modulating a phase locked frequency synthesizer, the method comprising:

providing a dynamic carrying device receiving and separating transmitting data into a residue part and carrying part when the transmitting data amplitude exceeds a threshold; wherein the threshold represents the upper bound value that the sigma-delta modulator can process without saturation;

sending the residue part to the sigma-delta modulator to generate a first modulus control signal;

providing an auxiliary modulator to receive the carrying part to generate a second modulus control signal; and providing an adder summing the first and second modulus control signals to generate a modulus modulation signal for the phase locked frequency synthesizer.

22. The dynamic carrying method as claimed in claim 21, wherein the sigma-delta modulator operates according to a signal transfer function and a noise transfer function, and the auxiliary modulator operates according to the signal transfer function.

23. The dynamic carrying method as claimed in claim 21, wherein the auxiliary modulator is provided by using a delay line module.

24. The dynamic carrying method as claimed in claim 21, wherein the transmitting data is a digital value of M bits with R LSB (least significant bit) bits representing the residue part and C MSB (most significant bit) bits representing the carrying part, the threshold corresponds to $2^R-1$ and M=R+C, M, R and C are integers.

25. The dynamic carrying method as claimed in claim 24, wherein the dynamic carrying device directly sends the residue part of R bits to the sigma-delta modulator and the carrying part of C bits to the auxiliary modulator.

26. The dynamic carrying method as claimed in claim 25, wherein if the transmitting data further comprises a sign bit, the method further comprises carrying out two's complement operation on the transmitting data when the sign bit indicates that the transmitting data value is negative, and the dynamic carrying device separating the transmitting data of M bits into the carrying part and the residue part.

* * * * *